United States Patent [19]
Nishi et al.

[11] Patent Number: 5,334,257
[45] Date of Patent: Aug. 2, 1994

[54] TREATMENT OBJECT SUPPORTING DEVICE

[75] Inventors: Hironobu Nishi, Sagamihara; Kazuo Terada, Machida, both of Japan

[73] Assignees: Tokyo Electron Kabushiki Kaisha, Tokyo; Tokyo Electron Tohoku Kab. Kaisha, Iwate, both of Japan

[21] Appl. No.: 66,416

[22] Filed: May 25, 1993

[30] Foreign Application Priority Data

May 26, 1992 [JP] Japan .................... 4-158745
Jan. 22, 1993 [JP] Japan .................... 5-027501

[51] Int. Cl.⁵ .............................. B05C 13/02
[52] U.S. Cl. ............................. 118/500; 269/903; 414/937; 414/938; 118/728
[58] Field of Search .............. 118/500, 715, 728; 414/416, 331, 937, 936, 939, 940; 156/345; 432/253; 269/903, 13

[56] References Cited
U.S. PATENT DOCUMENTS 5,162,047 11/1992 Wada et al. .

*Primary Examiner*—W. Gary Jones
*Assistant Examiner*—Brenda Lamb
*Attorney, Agent, or Firm*—Beveridge, DeGrandi, Weilacher & Young

[57] ABSTRACT

A plurality of ring trays supporting loaded treatment objects are arranged in parallel at predetermined spacing in the vertical axis direction and are supported by rods at a minimum of three locations separated from the rod couplings. Cutouts are provided in each ring tray that do not extend to the ring tray center open area. Supporting teeth are provided on the arms driven by drive devices and are inserted via the cutouts. The supporting teeth straddle the ring tray and are shifted relatively on both sides of the vertical direction, and can exchange the wafers between the ring tray and the supporting teeth. By this, problems occurring with regard to various types of heat treatment of the treatment objects, such as treatment object slippage, can be prevented. In addition, a plurality of treatment objects can be exchanged at one time, thereby allowing the exchanging time to be shortened.

11 Claims, 11 Drawing Sheets

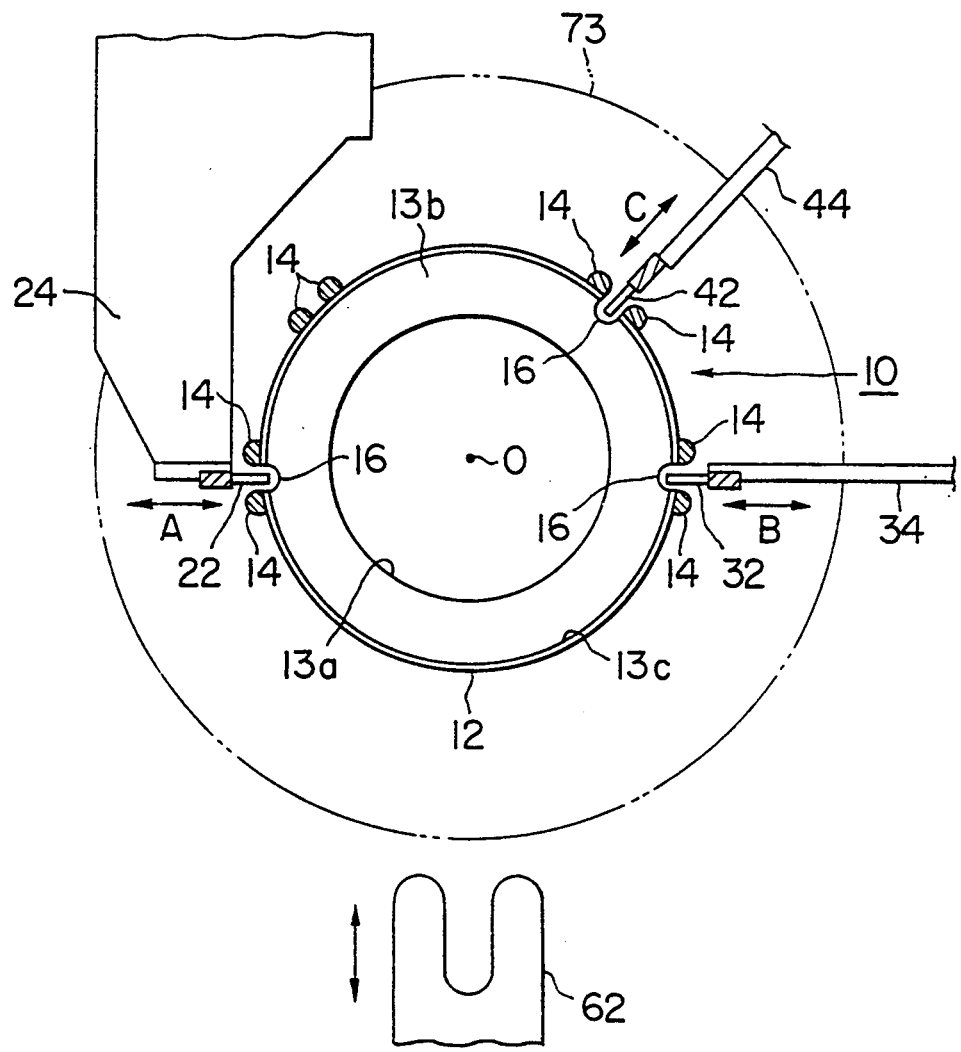
F I G. 1

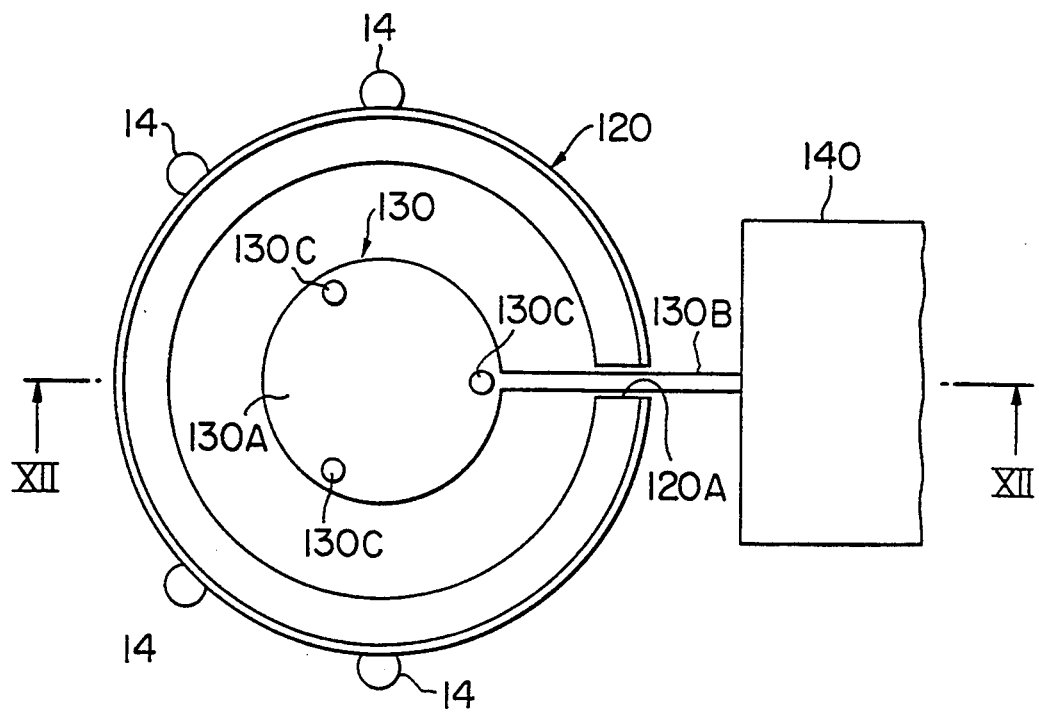
F I G. 11
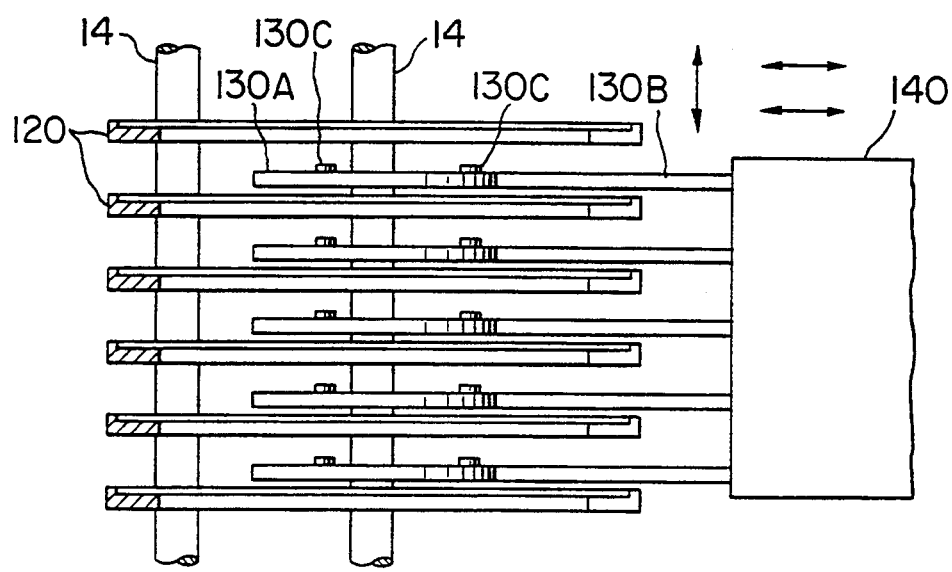
F I G. 12

TREATMENT OBJECT SUPPORTING DEVICE

BACKGROUND OF THE INVENTION

The present invention relates to a treatment object boat used in a vertical heat treatment apparatus.

In general, a quartz wafer boat is used for transporting semiconductor wafers to within a heat treatment apparatus and typically includes a plurality of rods secured to the side plates, and in each rod a stopper means is formed for supporting the wafers.

However, when various types of heat treatment, such as oxidation, diffusion, annealing and CVD processing are performed on the semiconductor wafers, major technical problems are encountered that include maintaining uniformity in the temperature distribution on the wafer surface, treatment within the wafer surface, and thickness of the various types of formed films such as oxidation film, in addition to preventing wafer slippage, inversion and other abnormalities. Furthermore, the trend toward large diameter wafers in recent years has rendered resolving these technical problems increasingly difficult.

Also, high speed heat treatment apparatus is being used in recent years, for the purpose of improving the uniformity and quality of the film formed on the wafer. By utilizing such a high speed heat treatment apparatus and performing heat treatment with the following type of cycle, the film uniformity and quality can be improved.

The temperature in the furnace is reduced when the wafers are inserted therein, as the atmosphere is mixed when the wafers are inserted, this is purged with a high purity gas, the temperature is then raised at high speed for performing such treatments as oxidation, diffusion and CVD. After treatment, the temperature is reduced at high speed.

The purpose of using high speed temperature increase and decrease in this manner is to raise throughput, but this encounters the following problems.

Ordinarily, with these various types of heat treatment apparatus, since the heat source is arranged at the perimeter of the wafer, the temperature change at the wafer circumference is faster than at the inner portions. Consequently, when high speed temperature increase and decrease are performed, a large temperature differential is produced in the wafer diameter and due to the resulting thermal distortion, numerous problems occur, such as wafer slippage and inversion.

Previously, as a means for resolving this problem, a type of boat known as a ring boat has been used. With this ring boat as the wafer supporting means, the heat capacity of the perimeter was made larger than that of the central portion, for example, by using a ring shaped tray. By using this type of shaped tray, when heat treating the wafers loaded on the tray, it is possible to prevent the temperature change at the perimeter from occurring faster than at the center, and maintenance of uniform temperature change in the wafer surface is possible.

Using this type of ring boat, two shifting methods were previously employed for shifting the wafers from the wafer cassette to the boat, which are indicated in FIGS. 13 and 14, and 15 and 16.

The conventional shifting method indicated in FIGS. 13 and 14 comprises a shifting fork 90 for shifting the wafer 18 and a raising fork 92 provided with a plurality (for example 3) of raising means 94 for raising the wafer from the bottom. This shifting means shifts the wafers 18 from the wafer cassette to the wafer boat in the following manner.

The wafer 18 is removed from the wafer cassette by the shifting fork 90. This shifting fork 90 which is holding the wafer 18 and the raising fork 92 are inserted from the side of the ring tray 96, which comprises the boat, as indicated in FIG. 13. Then as indicated in FIG. 14, the wafer 18 is raised by the raising fork 92, and by this the wafer 18 is supported by the projections 94, then the shifting fork 90 is retracted from the boat. Finally, the raising fork 92 is lowered and the wafer is loaded on the ring tray 96.

Another conventional shifting method is indicated in FIGS. 15 and 16 which comprises a shifting fork 90 for shifting the wafer and projections 100 for raising the wafer 18 from the bottom, and possesses a vertically movable raising base 98. In this system, the wafer 18 is shifted from the wafer cassette to the boat in the following manner.

The wafer 18 is removed from the wafer cassette by the shifting fork 90. As indicated in FIG. 15, this shifting fork 90 which is holding the wafer 18 is inserted from the side of the ring tray 96 which comprises the boat. Next, as indicated in FIG. 16, the raising base 98 which passes through the ring tray 96 center hole is raised, supporting and raising the wafer 18. Afterwards, the shifting fork 90 is retracted. Finally, the lifting base 98 is lowered, and the wafer 18 is loaded on the ring tray 96.

However, as mentioned above, the major technical problems encountered by regarding this type of heat treatment apparatus include maintaining uniform temperature distribution within the wafer surface, maintaining uniform film thickness and preventing wafer slippage and inversion. In addition to these, there are other serious technical problems such as the following.

There are the requirements to treat as large a number of wafers as possible during each batch treatment cycle and to the extent possible shorten the treatment time for each batch treatment cycle. Meeting these requirements is essential for improving wafer batch treatment efficiency and wafer production through-put, in addition to reducing the wafer production cost.

However, these requirements cannot be adequately fulfilled by the methods indicated in FIGS. 13–16. In the method of FIGS. 13 and 14, since the raising fork 92 with projections 94 needs to be inserted from the side between ring trays 96, a small pitch cannot be used for the ring trays 96. Consequently, treating a large number of wafers at each batch treatment cycle is extremely difficult. Especially difficult is conserving space in the height direction in a high vertical type heat treatment furnace.

Also, in the method of FIGS. 15 and 16, the wafers can only be exchanged one at a time. The wafers are shifted to the wafer boat in sequence from the top of the boat. Likewise, the wafers are removed from the boat one wafer at a time in sequence from the bottom. Consequently, shortening the exchange time per batch treatment cycle is extremely difficult. In addition, after loading all the wafers, operations such as inserting a dummy or monitor wafer at a desired position are impossible.

SUMMARY OF THE INVENTION

Objectives of this invention include, in the various types of heat treatment of treatment objects, the preventing of such occurrences as treatment object slippage and inversion, and to provide a treatment object boat that allows shortened exchange time per batch treatment cycle.

A treatment object boat in accordance with this invention comprises a plurality of ring shaped supporting plates for loading and supporting the treatment objects, a plurality of rods supporting this plurality of ring shaped supporting plates in parallel and at predetermined intervals in the vertical axis direction and, an exchange means supporting section for supporting the treatment object outer edge sections, that passes through cutout sections formed in at least 3 outer edge locations but do not extend to the center open area of the ring shaped supporting plates and avoid the coupling locations or sections with the rods, by which vertical drive is applied to the exchange means relative to the ring shaped supporting plates and the boat to allow treatment object exchange between the ring shaped supporting plates and the boat.

BRIEF DESCRIPTION OF THE DRAWINGS

FIG. 1 shows a partial plane view of a first embodiment of this invention,

FIG. 11 shows a plane view of another embodiment of a ring tray used with an object treatment boat in accordance with this invention, FIG. 12 shows a cross-sectional view of axis XII—XII of FIG. 11.

DETAILED DESCRIPTION OF PREFERRED EMBODIMENTS

Figure 2:
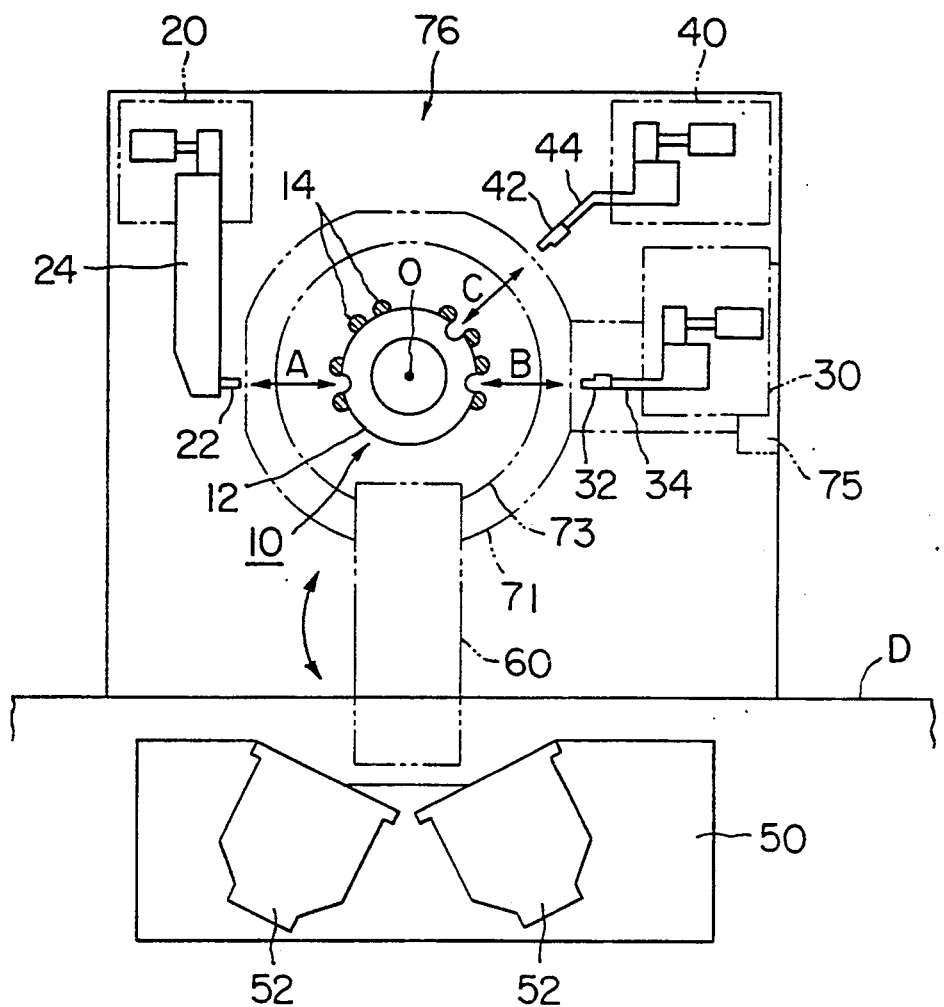
FIG. 2 is an abbreviated drawing of a heat treatment apparatus arrangement applicable to the treatment object boat of this invention.

Following is a description of a first embodiment of this invention with reference to the attached drawings.

As indicated by the plane view of FIG. 1, a treatment object holding means (wafer boat) 10 in accordance with this invention comprises a plurality of, for example, quartz ring tray 12 holding means for supporting such treatment objects as semiconductor wafers. The outer edges of these ring trays 12 are supported by at least 3, for example 8, rods 14, which are quartz supporting means, so as to support and arrange, for example, 30 semiconductor wafers, each in a horizontal state, in parallel and at a predetermined pitch in the vertical direction.

The boat 10 can be transported into and out of the heat treatment apparatus and contains the wafers for loading and unloading on the ring trays 12 in the vertical direction essentially in alignment with the furnace core (0) for wafer heat treatment in a vertical heat treatment apparatus.

Each ring tray 12 is provided with a center opening 13a and a wafer loading surface 13b, and desirably a circumference ridge 13c in order to prevent wafer dropping and for center alignment. By using this type of shape, in the wafer supported state, the central heat capacity can be reduced with respect to the circumference area and the temperature distribution in the wafer surface can be held uniform. Also, the center opening 13a promotes easy transfer of radiant heat from the wafer circumference to the wafer center in the heat treatment apparatus. In other words, at the wafer central area, contact with a large heat capacity item is avoided, thus preventing impairment of heat transfer efficiency.

In this embodiment, cutouts 16, not coupled to the center opening 13a, are provided at a minimum of 3 locations in the ring tray 12 circumference, for example, at the positions indicated in FIG. 1. These cutouts 16 are of a size and shape sufficient for passing wafer supporting means, for example, first, second and third teeth 22, 32 and 42 indicated in FIG. 1, for wafer loading and removal in the vertical direction with respect to the wafer loading surface 13b.

Also at least a sufficient number of rods 14 to stably support the ring trays 12 are secured at fixed positions with respect to the ring trays 12. In this embodiment, one rod is secured at each side of the each cutout 16 for a total of total of 6 rods, while the remaining two rods are secured at positions that enable stable support of the ring trays 12 in consideration of the positions of these 6 rods. The reason for securing the rods 14 at both sides of the cutouts 16 in FIG. 1 is described later.

Figure 3:
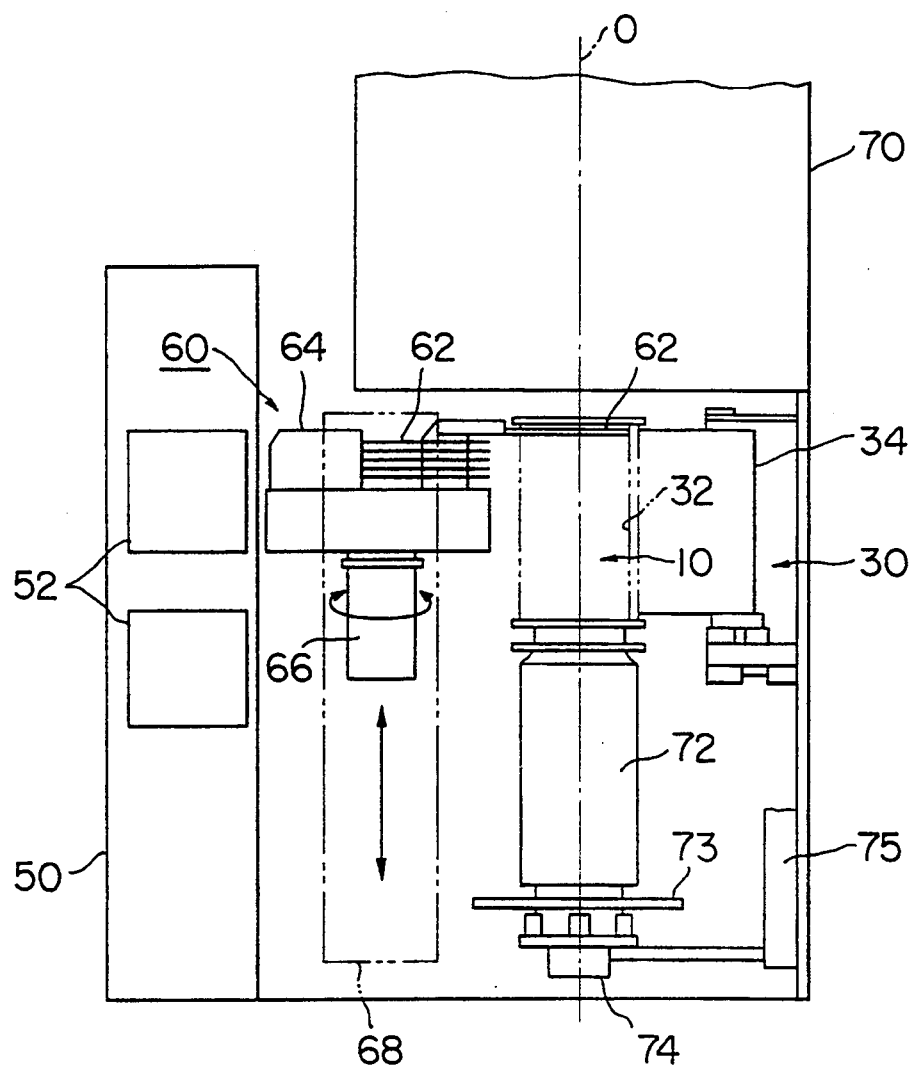
FIG. 3 shows a side view of the heat treatment apparatus shown in FIG. 2, FIG. 4A and FIG. 4B show side views of supporting teeth used with a treatment object boat in accordance with this invention.

Next is a description with reference to FIGS. 2 and 3 of the overall construction of a vertical heat treatment apparatus suitable for use with the object treatment boat in accordance with this embodiment. FIG. 2 is an abbreviated plane view of this apparatus, while FIG. 3 is an abbreviated lateral view. As indicated in FIG. 2, this vertical heat treatment apparatus mainly comprises a boat 10, supporting tooth drive (air cylinder or motor) devices 20, 30 and 40, a cassette stage 50, a shifting mechanism 60 and a heat treatment furnace 70.

As indicated in FIGS. 2 and 3, the unloading position is at the bottom of the heat treatment furnace 70 and the wafer boat 10 is arranged for raising and lowering with respect to the heat treatment furnace 70. At the front clean room side of the heat treatment furnace 70, wafer cassettes 52 are loaded in the cassette stage 50, and the shift mechanism, 60 for performing wafer exchange, is arranged between this stage 50 and the boat 10.

Rear space 76 is provided at the opposite side of the shift mechanism 60 from the boat 10 unloading position. At both sides of this rear space 76, tooth drive devices 20, 30 and 40 are arranged for respectively driving the first, second and third supporting teeth 22, 32 and 42 back and forth in directions A, B and C indicated in FIGS. 1 and 2.

The fork drive section 64 of the shift mechanism 60, as indicated in FIG. 3, can, for example, independently drive one or a plurality, for example 5, of forks 62 back and forth. These forks 62 are supported to allow independent or simultaneous driving back and forth.

The fork driving section 64 is supported for free rotation on rotation drive section 66, and rotation is enabled to allow facing the cassette stage 50 and the boat 10. In addition, the rotation drive section 66 can be freely moved in the vertical direction by supporting with the elevator mechanism 68.

The cassette stage 50 is capable of containing a plurality of wafer cassettes 52, each of which is capable of containing, for example, 25 semiconductor wafers loaded in the vertical direction. The wafers contained in these wafer cassettes 52 are shifted from the wafer cassette 52 to the fork 62 by the above mentioned fork drive section 64 of the shifting mechanism 60 which provides back and forth movement, and by the elevator mechanism 68 which provides up and down movement. Afterwards, the fork drive section 64 rotates from the rotation drive section 66, and the wafers are sequentially transported to the boat 10 and exchanged.

A temperature holding cylinder 72 containing, for example, quartz wool is provided at the bottom of this boat 10 and at the bottom of the temperature holding cylinder 72, in order to seal the heat treatment furnace 70 bottom opening, a gas sealing means, for example, an O-ring and a sealing cap flange 73 serving as a cover are provided.

The boat 10, temperature holding cylinder 72 and cap flange 73 are supported by a raising and lowering arm 74. This raising and lowering arm 74 is driven by a raising and lowering drive section 75, and is capable of loading and unloading the boat 10 and other items in the heat treatment furnace 70.

The heat treatment furnace 70 performs various processes such as oxidation, annealing, diffusion and CVD on the wafers contained in the wafer boat 10. In this example, a vertical type furnace possessing a quartz composition vertical type process tube enclosed by a heater is used.

Figure 4A:
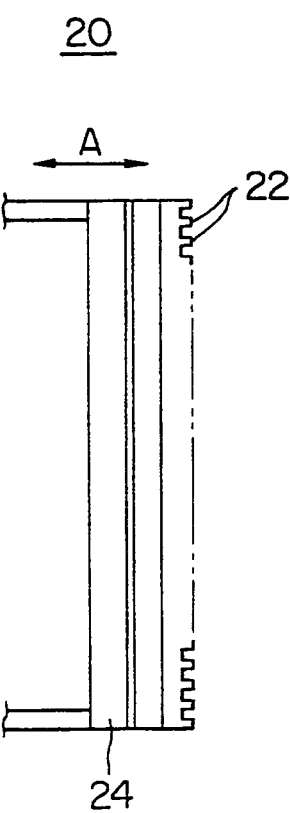
Figure 4B:
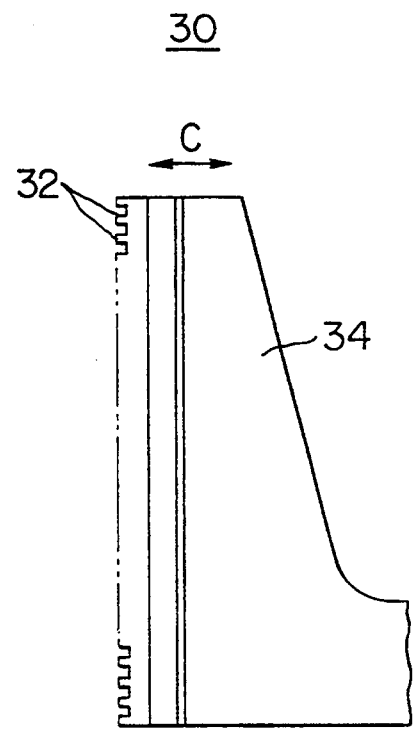

The first, second and third supporting tooth drive devices 20, 30 and 40 function to drive the first, second and third supporting teeth 22, 32 and 42, which temporarily hold the wafers 18, back and forth when the shifting mechanism 60 exchanges the wafers 18. The first, second and third supporting teeth 22, 32 and 42 driven by the first, second and third supporting tooth drive devices 20, 30 and 40, are at a minimum shaped so as to enable supporting the wafers, for example, as indicated in FIGS. 4A and 4B, provided with grooved teeth in a plurality of, for example 30, steps by which 30 wafers can be supported at one time.

In this embodiment, since 30 wafers can be loaded in the boat 10, the wafer holding operation is completed at one time by the supporting teeth 22, 32 and 42, and the wafer shifting process can be performed with optimum efficiency. In this manner by this embodiment, since a plurality of wafers can be held at once, the wafer shifting process can be conducted efficiently, and the processing time per batch treatment can be shortened.

The first, second and third supporting teeth 22, 32 and 42 are respectively supported by the first, second and third arms 24, 34 and 44. The arms 24, 34 and 44 can be respectively moved back and forth in directions indicated by A, B and C in FIG. 1 by drive mechanisms, for example, air cylinders provided for the drive devices 20, 30 and 40.

By this arrangement, the supporting teeth 22, 32 and 42 can be freely moved in and out of the cutouts 16 provided at 3 locations in the ring tray 12, and can temporarily hold the wafer 18 during the shifting operation. The respective retracted positions of the supporting teeth 22, 32 and 42 are at a minimum outside the flange cap 74 maximum diameter and desirably outside the maximum diameter of the manifold 71 of the heat treatment furnace 70 so as not to interfere with other parts such as the boat 10 during loading and unloading (see FIG. 1).

The reason for arranging the above supporting tooth drive devices 20, 30 and 40 at both sides of the rear space 76 is as follows.

Normally, with this type of apparatus, the clean room, which has high cost per unit of area, should be effectively utilized, and this design allows separation of the modules to be arranged in the clean room and the modules to be arranged in the maintenance room. For example, in FIG. 2, the modules below dividing line D are arranged in the clean room, while the modules above line D are arranged in the maintenance room. Consequently, cleaning, maintenance and adjustment of equipment such as tubes of the heat treatment furnace 70 manifold and wafer holding devices can be performed at this rear of the apparatus.

With this embodiment, as indicated in FIG. 2, the third supporting tooth drive device 40 is arranged toward the right of center, while the supporting tooth drive devices 20, 30 and 40 are designed for conserving space. Thus, the rear space 76 is adequately preserved. Consequently, the above mentioned apparatus maintenance can be conducted without hindrance from the supporting tooth drive devices 20, 30 and 40.

Figure 5:
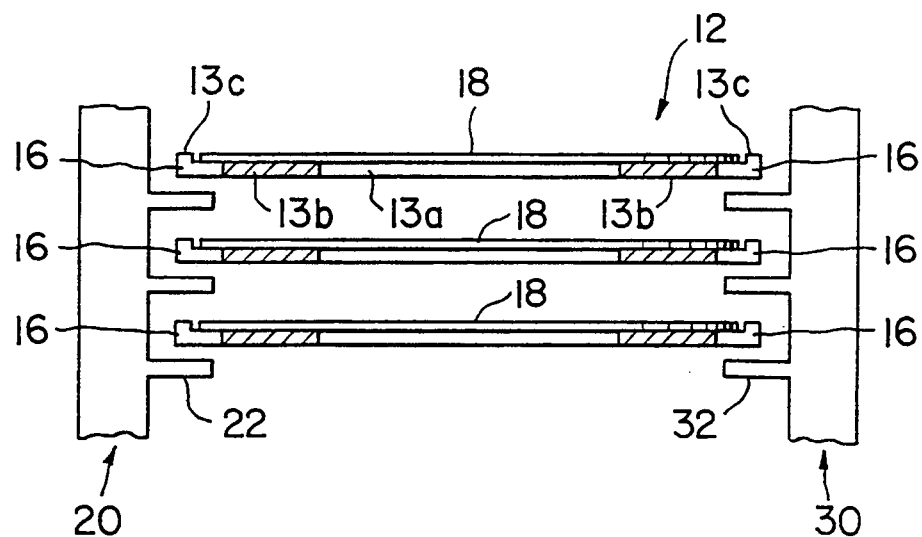
FIG. 5 is an abbreviated descriptive drawing of a treatment object exchange method using a treatment object boat in accordance with this invention and with the supporting teeth inserted between the wafers.
Figure 6:
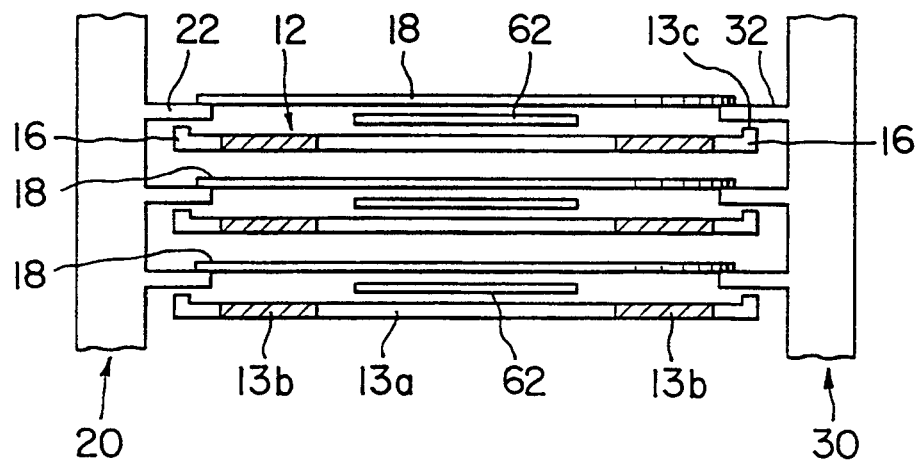
FIG. 6 is an abbreviated descriptive drawing of the same exchange method of FIG. 5 with the boat lowered and the wafers supported by the supporting teeth.

Next, a method of wafer 18 exchange using a boat in accordance with this invention will be described with reference to FIGS. 5 and 6. FIGS. 5 and 6 indicate a method of exchanging the wafers 18 loaded on the boat 10 to the fork 62. Conversely, shifting the wafers 18 from the fork 62 to the boat 10 can be performed by the reverse operation.

First, as indicated in FIG. 5, the supporting teeth 22, 32 and 42 (the third supporting tooth 42 is not indicated in the figure) are inserted by the above mentioned drive mechanism at desirably the center position between vertically adjacent wafers 18.

The reason for this is to prevent the supporting teeth 22, 32 and 42 from contacting the ring tray 12 or wafers 18, when inserting supporting teeth 22, 32 and 42, due to such factors as drive section mechanical tolerance. In this case, since the cutouts 16 are provided in the ring tray 12, as indicated in the figures, the maximum range limit of this mechanical tolerance can be used. Consequently, the ring tray 12 vertical arrangement pitch can be used at the minimum limit. This allows the maximum number of wafers to be loaded in the boat 10, and the maximum number of wafers can be treated per batch treatment.

In this manner, after inserting the supporting teeth 22, 32 and 42, for example in this embodiment, the relative drive between the boat 10 and supporting teeth 22, 32 and 42 lowers the boat 10. When this occurs, each supporting tooth 22, 32 and 42, shifts relatively in the upward direction and passes from the bottom of the ring tray 12 through the respective cutout 16. As indicated in FIG. 6, this operation inserts the supporting teeth 22, 32 and 42 between the wafer 18 and the ring tray 12. The fork 62 is then raised and the wafer 18 is carried on the fork 62. The wafer 18 loaded on the fork 62 is returned to the wafer cassette 52 by a reciprocal or rotary etc. mechanism provided with the fork drive section 64. Thereafter, by changing the boat 10 vertical position and performing this procedure for a predetermined number of times, all the wafers 18 in the boat 10 can be returned to the wafer cassette 52.

When shifting the wafers 18 from the wafer cassette 52 to the boat 10, this is performed by the reverse procedure to the shifting method indicated in FIGS. 5 and 6. Then, after loading a predetermined number of wafers 18 in the boat 10, the raising and lowering arm 74 loads the boat etc. into the heat treatment furnace 70 from the treatment object loading section and heat treatment such as oxidation, diffusion and CVD is performed. Then by the previously mentioned exchange method, the treated wafers 18 are returned to their previous positions in the wafer cassette 52.

As described above, in this embodiment, by providing such means as cutout sections 16 in the ring tray 12, a large number of wafers can be exchanged at one time. In addition, since the minimum ring tray arrangement pitch can be used, the treatment time per batch treatment can be shortened.

Next, the thermal capacity change near a cutout section of this type and the accompanying effects on the uniformity of the temperature distribution on the wafer surface are considered.

The ring tray 12 used in this embodiment has an increased thermal capacity in the circumference area beyond the center for the purpose of reducing temperature increase in the circumference area by utilizing thermal radiation from the circumference.

However, by providing the cutouts 16, the thermal capacities in their areas is reduced. However, on the basis of experiments indicated in FIGS. 7 and 8, the produced portional temperature increase by providing cutout sections 16 was confirmed to be within the permissible range, as described below. Also, regarding this embodiment, as indicated in FIG. 1, since the rods 14 are arranged at both sides of the cutout openings, the thermal capacity in these areas increases. In addition, the radiant heat that should reach the cutout areas if the rods 14 were absent does not do so because of the rod 14 arrangement.

Figure 7:
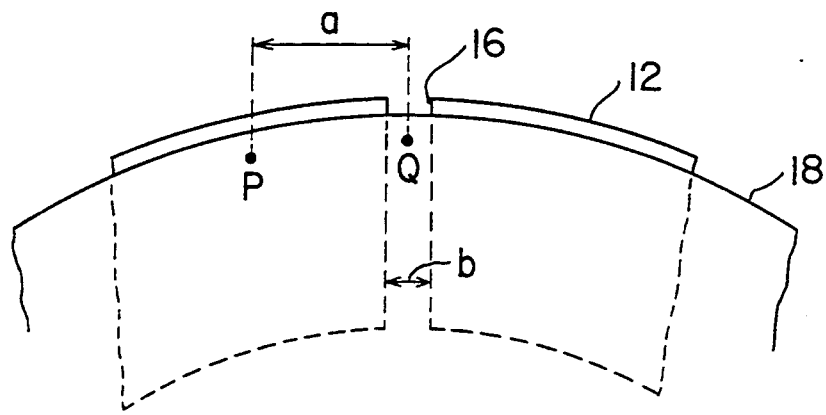
FIG. 7 is a descriptive drawing of an experimental method for measuring the temperature difference in the wafer surface.
Figure 8:
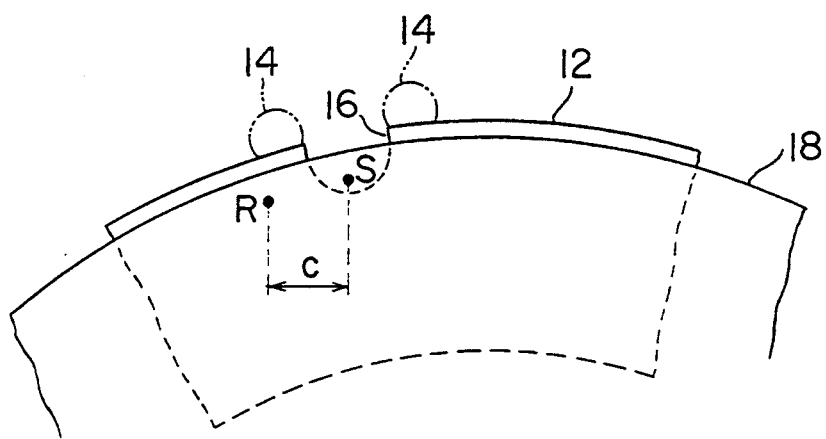
FIG. 8 is a descriptive drawing of an experimental method for measuring temperature difference in the wafer surface used in a ring tray with a different cutout section from that of FIG. 7.

FIG. 7 indicates temperature measurements at points P and Q on a wafer on a ring tray 12 in the case where the cutout 16 extends to the central opening area. FIG. 8 indicates temperature measurements at points R and S on a wafer on a ring tray 12 in the case where the cutout 16 does not extend to the central opening area. In FIGS. 7 and 8, the measuring distances a, b and c are respectively 20 mm, 5 mm and 10 mm.

In absence of a cutout 16, the maximum temperature difference between the center and circumference was measured to be 21.6° C. In the FIG. 7, the maximum temperature difference between the center of the ring tray 12 and point P was measured as 21.6° C., and the maximum temperature difference between points P and Q was measured as 19.4° C. In other words, the maximum temperature difference between the center and point Q was 41.0° C. Normally, since a temperature difference of more than 50° C. between the center and circumference is known to produce such problems as slippage, with the cutout shape indicated in FIG. 7, a tolerance margin is nearly absent.

However, in the case shown in FIG. 8, the maximum temperature difference between the center and point R was 21.6° C., and the maximum temperature difference between points R and S was 6.9° C. In other words, the maximum temperature difference between the center and point S was 28.5° C., which is ample margin with respect to the slippage producing temperature difference of 50° C. Also, when rods 14 are arranged at the positions shown by the broken lines in FIG. 8, this maximum temperature difference is further improved to 26.5° C.

In recent years, high speed heat treatment apparatus are being used for the purpose of improving the film uniformity and quality. By performing treatment in such high speed heat treatment apparatus in the following type of cycle, film uniformity and quality can be improved.

Figure 9:
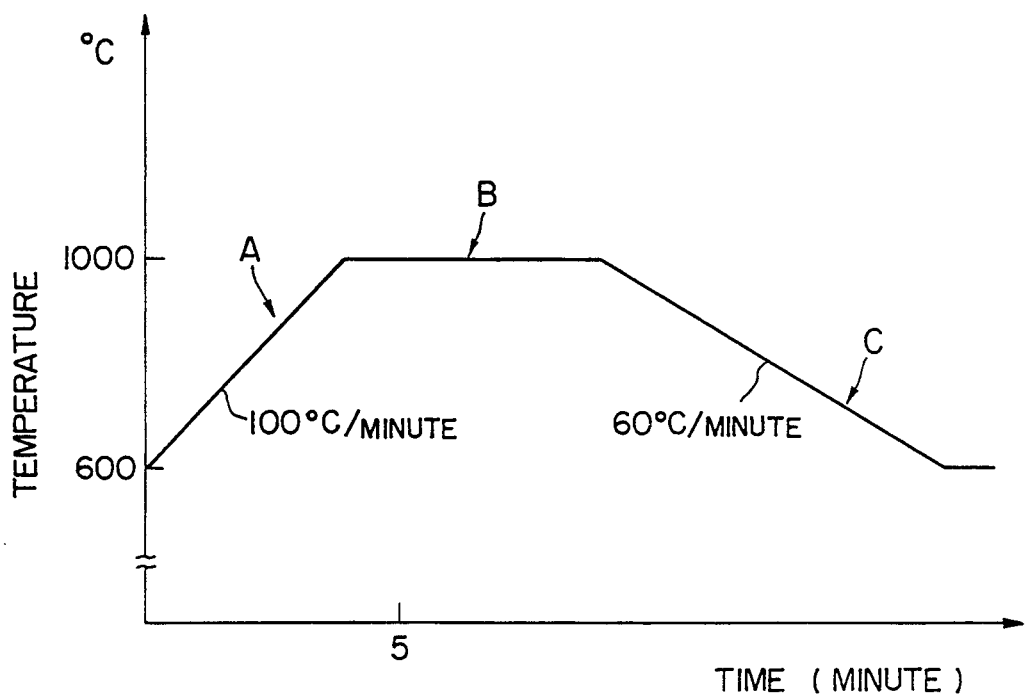
FIG. 9 is a descriptive drawing of a heat treatment cycle with a high speed heat treatment apparatus.

First, reduce the temperature when the wafers are inserted in the heat treatment furnace, then purge the atmosphere mixed by inserting the wafers with high purity gas. Afterwards, raise the temperature at high speed and perform such treatment as oxidation, diffusion and CVD. At completion of treatment, reduce the temperature at high speed. FIG. 9 indicates an example of a temperature change cycle in this case In this example, after 600° C., the temperature is raised 100° C. per minute to 1000° C., then such treatment as oxidation, diffusion or CVD is performed.

An example of a heater capable of this type of high speed temperature increase and decrease can utilize a resistance heating element comprising molybdenum disilicide ($MoSi_2$) or Kanthal (tradename): a metal alloy wire of iron (Fe), chromium (Cr) and aluminum (Al). In this case, since the temperature difference between the center and circumference is maximum at points A and C in FIG. 9, the shape of the cutout 16 and the diameter of the rod 14 are adjusted so that this temperature difference between center and circumference is within the tolerance range where problems such as slippage are not produced. From this viewpoint, it is desirable for the diameter of the rod 14 to be as large as possible in order to prevent occurrence of slippage and other problems.

Conversely, especially in film formation treatment, at the state of the point B of FIG. 9, i.e., the state where the temperature is constant, if the diameter of the rod 14 is large, gas flow is impaired and defects are produced in the film thickness surface uniformity. Consequently, a minimum diameter of the rod 4 in the range where wafer slippage or inversion etc. are not produced, is desirable. From these type reasons, the desirable diameter of the rod 14 is 9–15 mm, with 11–13 mm preferred.

Figure 10:
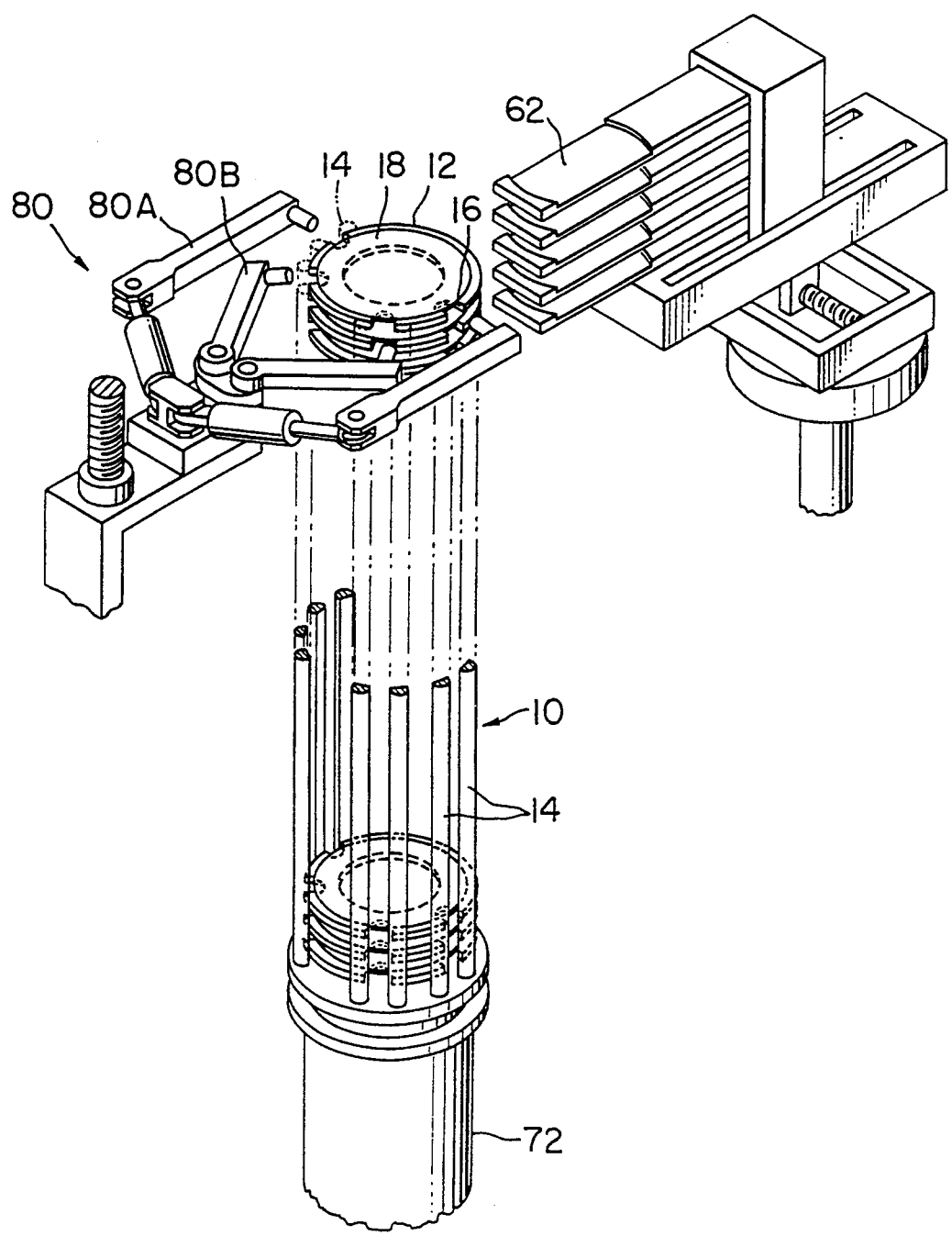
FIG. 10 is an inclined view of a treatment object boat according to another embodiment of this invention.
Figure 13:
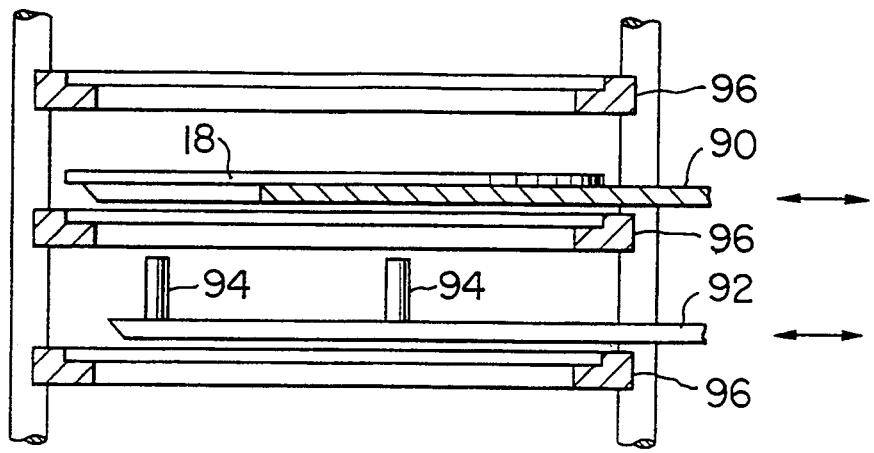
FIG. 13 is a descriptive drawing of a conventional wafer exchanging method using a raising fork and shows the raising fork inserted from the side of the boat.
Figure 14:
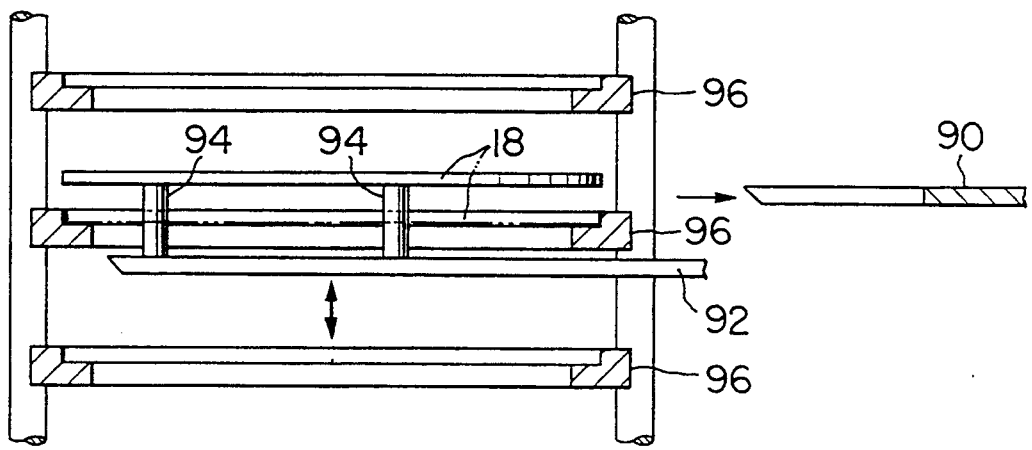
FIG. 14 is an extension of FIG. 13 and shows the raising fork raising and supporting the wafer.
Figure 15:
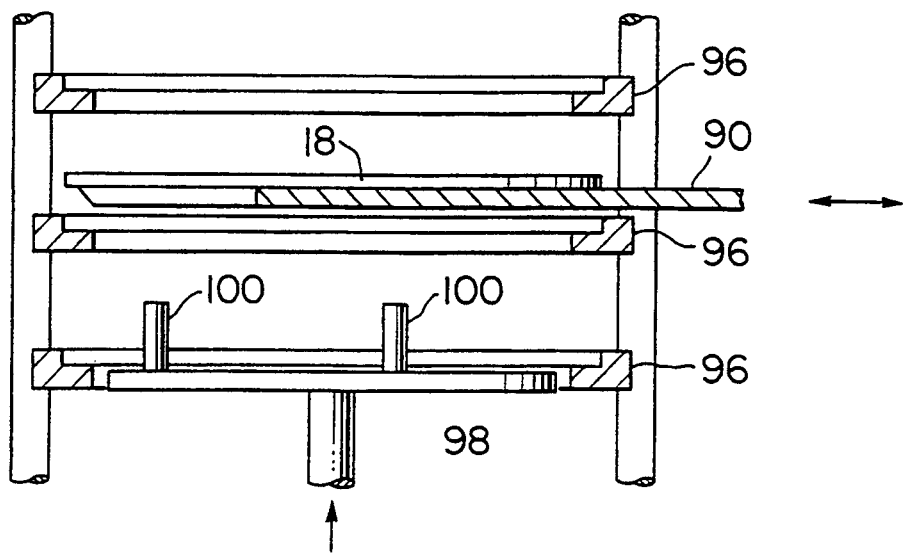
FIG. 15 is a descriptive drawing of a conventional wafer exchanging method using a vertically movable raising base and shows the state with the raising base inserted in the center hole of the ring tray.
Figure 16:
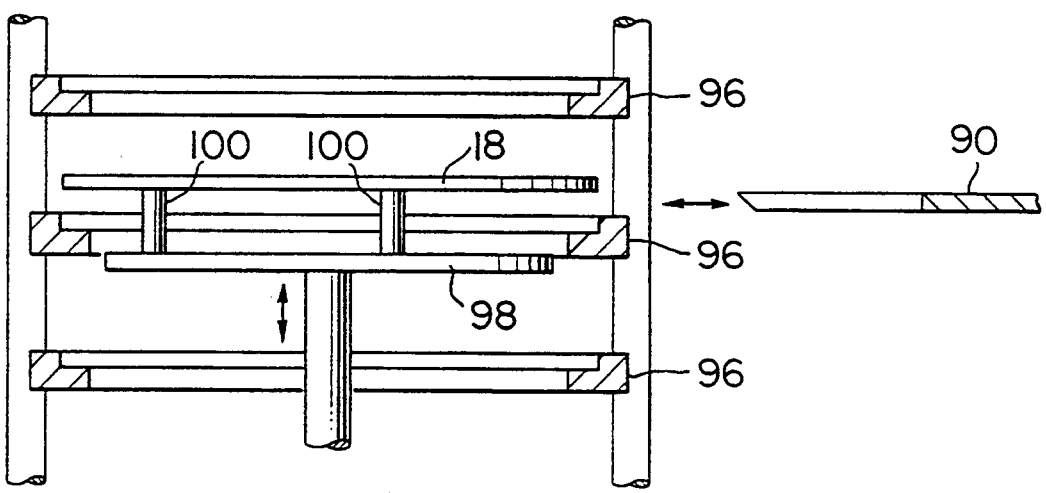
FIG. 16 is an extension of FIG. 15 and shows the raising base in the raised state and supporting the wafer.

FIG. 10 indicates a variation of this embodiment. In this variation example, the cutout sections in the ring tray 12 are provided, but the shape of the supporting tooth drive device 80 differs. This supporting tooth drive device 80 functions for rotational drive of one or a plurality of jointed arms 80A and 80B, whereby the wafers 18 are held and shifted between the fork 62 and the boat 10. In this case it is desirable to provide the same number of supporting tooth drive devices 80 as forks 62.

The above described embodiment does not limit this invention and numerous variations are possible within the scope of the objectives of this invention.

For example, the shape of the cutouts 16 of a boat in accordance with this invention is not limited to the example indicated in FIG. 1. Other shapes, such as rectangular, are also acceptable provided at the least they enable supporting the wafers 18, and allow insertion of supporting teeth 22, 32 and 42.

Also, the positions of the cutouts 16 are not limited to those indicated in FIG. 1. At the least, positions that allow stably supporting the wafers 18 by inserting the supporting teeth are acceptable. For example, changing the positions provided for the 3 locations of FIG. 1, as well as providing the cutouts 16 in four or more locations are acceptable. Also, the arrangement of the supporting tooth drive devices 20, 30 and 40, although desirably in a manner that preserves the space 76, is not limited to that indicated in FIG. 1.

Also, the arrangement of the rods 14, although desirably at both sides of the cutouts 16 at the circumference portion, is not restricted to the above description. Other arrangements of at least 3 rods 14 are acceptable if in a range where problems such as wafer slippage and inversion do not occur, and they are able to stably support the ring tray 12.

Also, the drive section 26, 36 and 46 composition is not limited to the air cylinder example mentioned in this embodiment, but can also comprise a motor or other means that is at least capable of driving supporting teeth 22, 32 and 42, by which the wafers can be supported.

Although quartz is a typical material for this type of boat, the boat can be formed from other materials such as SiC, which at the least possess thermal durability and do not produce contamination under high temperature.

As described above, among the advantages provided by this invention are enabling the simultaneous exchanging of a plurality of treatment objects by providing cutout sections in the circumference section of a ring shaped supporting plate, and via these cutout sections, shifting a loading means supporting section vertically relative to a ring shaped supporting plate, in addition to holding the treatment object surface temperature difference to less than the maximum permissible value.

An alternative construction of the ring tray cutout section is indicated in FIG. 11. In this case, the cutout is formed in the ring tray 120 at only one location in the circumference direction, while the rods 14 are provided at separated positions. Thus, the cutout forms a narrow slit 120A extending in the diameter direction from the center opening to the outer edge. Consequently, the plane view of this ring tray 120 resembles a C-shape.

As indicated in FIG. 11, a fork 130 for exchanging wafers with respect to this ring tray 120 is provided with a disk shaped wafer loading plate 130A at the center of the ring tray 120 and a supporting arm 130B. Loading pins 130C are provided at equal positions in the circumference direction on the surface of the wafer loading plate 130A opposite the wafer bottom face. The supporting arm 130B width is able to pass through the slit 120A of the ring tray 120, and one end of the supporting arm 130B is retained by the fork drive section 64 indicated in FIG. 3.

The fork 130 sets the supporting arm 130B opposite the slit 120A of the ring tray 120, so it does not interfere with the ring tray 120 when raised and lowered. Then the fork 130 sets the wafer bottom face on the loading pins 130C of the wafer loading plate 130A, after which the wafer can be raised from the ring tray 120.

Consequently, when exchanging wafers, as indicated in FIG. 12, the fork 130 is inserted at the bottom position of the ring tray 120, and by raising from this position, the supporting arm 130B of the fork 130 is passed through the slit 120A in the ring tray 120 and the wafer can be placed on the loading pins 130C.

What is claimed is:

1. A treatment object retaining device comprising:
    a plurality of ring shaped supporting means for supporting loaded treatment objects;
    a plurality of supporting rods arranged in the vertical axis direction for supporting said plurality of ring shaped supporting means in parallel and at predetermined spacing in the vertical direction;
    cutout sections not extending to the center opening of said ring shaped supporting plate provided in at least three locations of said ring shaped supporting means other than coupling sections of said ring-shaped supporting means with said supporting rods; and
    a plurality of supporting teeth freely entering and leaving the said cutout sections.

2. The treatment object retaining device according to claim 1, wherein said supporting rods are coupled on both sides of said cutout sections at the outer edge of said ring shaped supporting plate.

3. The treatment object retaining device according to claim 1, wherein means for relatively shifting either said ring shaped supporting device or said supporting teeth in the vertical axis direction is provided.

4. The treatment object retaining device according to claim 1, wherein said ring shaped supporting device comprises a ring shaped treatment object loading surface and a ring shaped ridge at the circumference of said loading surface.

5. The treatment object retaining device according to claim 1, wherein said supporting teeth comprise multiple-stepped grooved teeth.

6. The treatment object retaining device according to claim 1, wherein a supporting tooth drive means is arranged to the right of the center opening of said ring-shaped supporting plate in a plane view of the device.

7. The treatment object retaining device according to claim 1, wherein the cutout section shape is semicircular.

8. The treatment object retaining device according to claim 1, wherein the cutout section shape is rectangular.

9. The treatment object retaining device according to claim 1, wherein said device is used as a wafer boat and said treatment objects comprise semiconductor wafers.

10. The treatment object retaining device according to claim 1, wherein said plurality of supporting teeth are driven by drive devices in three directions and each of said supporting teeth can be moved freely back and forth in each said direction.

11. A treatment object retaining device comprising:
    a plurality of ring shaped supporting means for supporting loaded treatment objects;
    a plurality of supporting rods arranged in the vertical direction for supporting said plurality of ring shaped supporting means in parallel and at a predetermined spacing in the vertical direction;
    a narrow shaped slit extending from the center opening areas of said ring shaped supporting means in the radial direction to the outer edge; and
    a supporting arm passing through said slit to the center opening area of said ring shaped supporting means and couples a treatment object loading section with a loading section.

* * * * *